United States Patent
Ng et al.

(10) Patent No.: US 10,340,011 B2
(45) Date of Patent: *Jul. 2, 2019

(54) THREE-DIMENSIONAL ADDRESSING FOR ERASABLE PROGRAMMABLE READ ONLY MEMORY

(71) Applicant: Hewlett-Packard Development Company, L.P., Houston, TX (US)

(72) Inventors: Boon Bing Ng, Singapore (SG); Hang Ru Goy, Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 15/851,413

(22) Filed: Dec. 21, 2017

(65) Prior Publication Data

US 2018/0114579 A1  Apr. 26, 2018

Related U.S. Application Data

(63) Continuation of application No. 15/489,272, filed on Apr. 17, 2017, now Pat. No. 9,928,912, which is a continuation of application No. 15/114,823, filed as application No. PCT/US2014/014014 on Jan. 31, 2014, now Pat. No. 9,773,556.

(51) Int. Cl.

| | |
|---|---|
| G11C 16/08 | (2006.01) |
| G11C 8/04 | (2006.01) |
| G11C 16/24 | (2006.01) |
| G11C 8/08 | (2006.01) |
| G11C 16/10 | (2006.01) |
| G11C 16/26 | (2006.01) |
| H01L 27/11514 | (2017.01) |
| H01L 29/423 | (2006.01) |
| H01L 29/78 | (2006.01) |

(Continued)

(52) U.S. Cl.
CPC ............... *G11C 16/08* (2013.01); *G11C 8/04* (2013.01); *G11C 8/08* (2013.01); *G11C 8/12* (2013.01); *G11C 16/10* (2013.01); *G11C 16/24* (2013.01); *G11C 16/26* (2013.01); *H01L 27/11514* (2013.01); *H01L 27/11582* (2013.01); *H01L 29/42344* (2013.01); *H01L 29/7841* (2013.01)

(58) Field of Classification Search
CPC ........ G11C 7/1018; G11C 8/04; G11C 16/102
USPC ................. 365/185.13, 189.17, 230, 230.05
See application file for complete search history.

(56) References Cited

U.S. PATENT DOCUMENTS

| | | |
|---|---|---|
| 4,395,764 A | 7/1983 | Matsue |
| 4,860,252 A | 8/1989 | Sykora |

(Continued)

FOREIGN PATENT DOCUMENTS

| | | |
|---|---|---|
| JP | S56-041574 | 4/1981 |
| JP | S63-136397 | 6/1988 |

(Continued)

OTHER PUBLICATIONS

"International Search Report and Written Opinion of the International Searching Authority", PCT Application No. PCT/US2014/014014, dated Oct. 27, 2014, 10 pages.

(Continued)

*Primary Examiner* — Han Yang
(74) *Attorney, Agent, or Firm* — Mannava & Kang (57) ABSTRACT

Three-dimensional addressing for erasable programmable read only memory (EPROM) can include a number of EPROM banks, a number of shift registers, a row select data signal, a column select data signal, and a bank select data signal.

15 Claims, 3 Drawing Sheets

(51) Int. Cl.
*G11C 8/12* (2006.01)
*H01L 27/11582* (2017.01)

(56) References Cited

U.S. PATENT DOCUMENTS

| | | |
|---|---|---|
| 5,029,020 A | 7/1991 | Norder et al. |
| 5,206,942 A | 4/1993 | Ibi |
| 5,828,814 A | 10/1998 | Cyman et al. |
| 6,198,667 B1 | 3/2001 | Joo |
| 6,402,279 B1 | 6/2002 | Torgerson et al. |
| 6,592,212 B1 | 7/2003 | Kakutani |
| 7,080,193 B2 | 7/2006 | Roohparvar |
| 9,281,045 B1 | 3/2016 | Anand et al. |
| 2003/0081491 A1 | 5/2003 | Miki |
| 2007/0165482 A1* | 7/2007 | Asauchi ............ G06F 21/79 365/239 |
| 2007/0291560 A1 | 12/2007 | Hsieh et al. |
| 2010/0271439 A1 | 10/2010 | Sheahan et al. |
| 2010/0328405 A1 | 12/2010 | Ness et al. |
| 2012/0281472 A1 | 11/2012 | Cernea |
| 2012/0297245 A1 | 11/2012 | Li et al. |
| 2012/0300568 A1 | 11/2012 | Park et al. |
| 2017/0106648 A1 | 4/2017 | Ge et al. |

FOREIGN PATENT DOCUMENTS

| | | |
|---|---|---|
| JP | H03-126560 | 5/1991 |
| JP | H06-236680 | 8/1994 |
| JP | 2012-248265 | 12/2012 |
| JP | 2000-349163 | 12/2015 |
| RU | 2258010 C2 | 8/2005 |
| RU | 2285617 C2 | 10/2006 |
| WO | WO-2007024656 | 3/2007 |

OTHER PUBLICATIONS

SPEAr320 Architecture and Functionality; RM0307 Reference Manual; Sep. 2011, 355 pages.

* cited by examiner

THREE-DIMENSIONAL ADDRESSING FOR ERASABLE PROGRAMMABLE READ ONLY MEMORY

CLAIM FOR PRIORITY

This application is a Continuation of commonly assigned and co-pending U.S. patent application Ser. No. 15/489,272, filed Apr. 17, 2017, which is a Continuation of U.S. patent application Ser. No. 15/114,823, filed Jul. 27, 2016, now U.S. Pat. No. 9,773,556, issued Sep. 26, 2017, which is a National Stage filing under 35 U.S.C. § 371 of PCT Application Number PCT/US2014/014014, filed Jan. 31, 2014, the disclosures of which are hereby incorporated by reference in their entireties.

BACKGROUND

Memory is an important element to store information in a system. Memory can be achieved by creating and maintaining a number of different states, such as "0" and "1." Erasable programmable read only memory (EPROM) is one type of non-volatile memory comprising an array of individually programmed floating-gate transistors which store memory units (e.g., bits) coded by the conductivity of the storage transistors.

Integrated print heads (IPHs) can include memory. IPH memory can be used to store information like Pen ID, Unique ID, Analog Serial Number (ASN), security information, and other IPH feature enhancement information.

DETAILED DESCRIPTION

Integrated print heads (IPHs) can utilize a variety of different memory technologies. For example, IPHs can use metal fuse memory technology to store information. However, erasable programmable read only memory (EPROM) provides benefits over the metal fuse technology in that there is a relatively smaller size requirement for an EPROM selector transistor, there is no necessity for potentially damaging mechanical force in programming EPROM, and it is impossible to recognize state status under visual inspection of EPROM.

An IPH platform's ability to implement functions can be limited by the amount of memory it has (e.g., the number of addressable memory units that the memory stores). That is, the more information that can be stored on an IPH, the more features that are able to be implemented on the IPH. The number of addressable memory units (e.g., bits) for an IPH can be limited by many factors.

Conventional IPH EPROM addressing is accomplished using direct addressing. Direct addressing utilizes an independent data signal for each bank of EPROM. As a result, direct addressing requires one register (e.g., shift register) per EPROM bank in order to address the EPROM memory units of the corresponding EPROM bank.

The amount of silicon (Si) real estate available for a given register and associated EPROM can be limited by many factors. For example, size constraints imposed by IPH size and/or function can serve to limit the available Si real estate. Further, cost constraints associated with manufacturing a given IPH can limit the amount of available Si real estate available for its register and corresponding EPROM bank. IPH Si real estate limitations translate to IPH register and EPROM bank limitations, which accordingly translates to addressable memory unit constraints.

Examples of the present disclosure include a print head memory device utilizing a three-dimensional addressing scheme for EPROM along with a system and a method for three-dimensional addressing for an EPROM memory unit. The print head memory device, systems, and methods can utilize a number of shift registers, each connected to a number of EPROM banks, to generate a three-dimensional EPROM address. The three-dimensional EPROM address can include a row select data signal, a column select data signal, and a bank select data signal. The row select data signal can specify a row portion of an individual EPROM memory unit address, the column select signal can specify a column portion of the individual EPROM address, and the bank select signal can specify an EPROM bank of a number of EPROM banks associated with the individual EPROM memory unit address specified by the first and second shift registers. As a result, examples of the present disclosure utilizing a three-dimensional EPROM address can address EPROM memory units in a greater number of EPROM banks while utilizing less Si real estate (e.g., fewer shift registers since each EPROM bank does not require a corresponding shift register to address it) than conventional methods.

Figure 1:
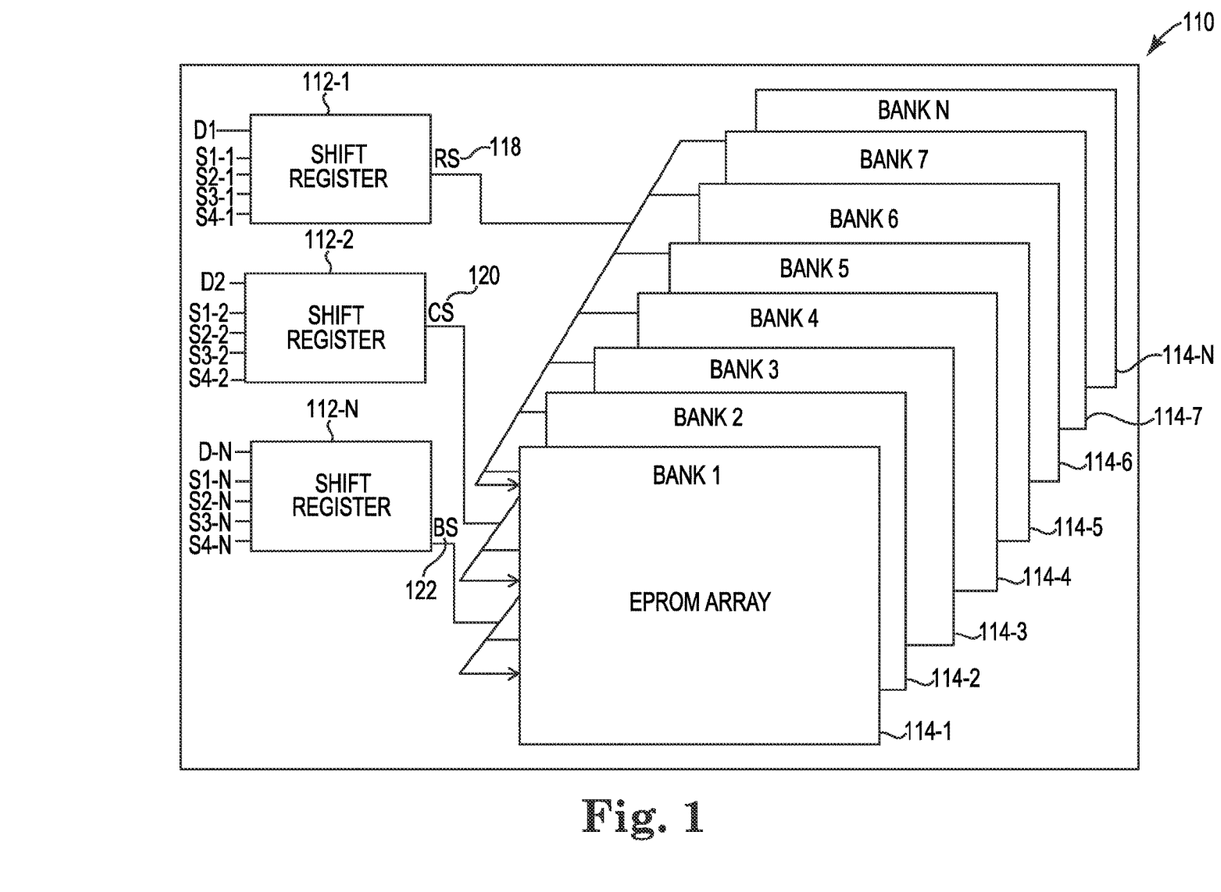
FIG. 1 is a diagram of an example of a print head memory device according to the present disclosure.

FIG. 1 illustrates an example of a print head memory device 110 according to the present disclosure. The print head memory device 110 can be integrated into any IPH design. For example, the print head memory device 110 can be a portion of an inkjet IPH having the print head integrated into the ink cartridge. The IPH associated with the print head memory device 110 can include, for example, a housing, an ink chamber, a number of inlets and outlets in fluid communication with the ink chamber, a number of firing resistors, various electrical contacts, and a controller. The controller can include the print head memory device 110.

The print head memory device 110 can include a number of shift registers 112-1, . . . , 112-N. While three shift registers 112-1, . . . , 112-N are illustrated in FIG. 1, the invention is not so limited. For example, the number of shift registers 112-1, . . . , 112-N can be any number of shift registers within constraints of the available Si real estate.

In some examples, each of the number of shift registers 112-1, . . . , 112-N can include a cascade of flip-flop circuits with two stable states sharing a common time clock. Each flip-flop circuit can be connected to the data input of the next flip-flop in the cascade, resulting in a circuit that shifts a stored bit array by shifting in the data received at its input and shifting out the last bit in the array at each transition of a clock input. Each flip-flop circuit of a shift register can be referred to as a stage. The number of shift registers 112-1, . . . , 112-N can include any number of stages. For example, the shift registers can include eight stages as depicted in FIG. 1.

The shift registers 112-1, . . . , 112-N can be any type of shift register. For example, each of the number of shift registers 112-1, . . . , 112-N can be a serial-in parallel-out shift register.

Shift registers 112-1, . . . , 112-N can accept a number of input signals (e.g., select signals S1-1, . . . , S4-N, data signals D1, . . . , D-N, etc.) via any number of input lines. The select signals S1-1, . . . , S4-N can be used to pre-charge and advance the shift register 112-1, . . . , 112-N receiving the select signals S1-1, . . . , S4-N. For example, the shift register 112-1 can be advanced by repeatedly pulsing the select signals S1-1, . . . , S4-1 where each cycle through the four select signals S1-1, . . . , S4-1 causes the shift register 112-1 to advance by one stage. The select signals S1-1, . . . , S4-N can be independent signals or a common signal. For example, the select signals S1-1, S1-2, S1-N can be a common signal instead of distinct signals. The same can be true of select signals S2-1, S2-2, S2-N, select signals S3-1, S3-2, S3-N, and select signals S4-1, S4-2, S4-N.

The data signals D1, . . . , D-N can serve as initiating signals and can communicate the row and column address of an EPROM memory unit. The data input by signals D1, . . . , D-N can be arbitrarily assigned to any of the shift registers 112-1, . . . , 112-N such that a particular shift register 112-1, . . . , 112-N is not limited to receiving a particular type of data input.

Each of the number of shift registers 112-1, . . . , 112-N can be connected to a number of memory banks 114-1, . . . , 114-N. Any number of memory banks 114-1, . . . , 114-N is possible. However, the number of memory banks 114-1, . . . , 114-N of the print head memory device 110 can be limited by the number of shift registers 112-1, . . . , 112-N and the number of stages and cycles of each of the shift registers 112-1, . . . , 112-N since addressing a number memory banks 114-1, . . . , 114-N includes having sufficient shift registers/shift register stages/shift register cycles to distinguish between memory units of the number of memory banks 114-1, . . . , 114-N.

Each memory bank 114-1, . . . , 114-N can be an array of addressable EPROM memory units (e.g., bits, etc.). The memory bank 114-1, . . . , 114-N can be any size EPROM array with any number of individual EPROM memory unit addresses. For example, a memory bank 114-1, . . . , 114-N logically can be an EPROM array of eight rows by eight columns forming sixty-four individual addressable EPROM memory units. The logical arrangement and number of addressable bits can be limited by the number of stages and cycles of each of the shift registers 112-1, . . . , 112-N since addressing a number of individual addressable EPROM memory units includes having sufficient shift register stages/ shift register cycles to distinguish between them.

Each shift register 112-1, . . . , 112-N can generate a number of outputs (e.g., row select signal (RS) 118, column select signal (CS) 120, bank select signal (BS) 122). Although FIG. 1 illustrates the RS 118, CS 120, and BS 122 signals being generated from separate shift registers 112-1, . . . , 112-N, the disclosure is not so limited. More than one signal can be generated from an individual shift register of the number of shift registers 112-1, . . . , 112-N. For example, if each of the memory banks 114-1, . . . , 114-N included an EPROM array logically comprising eight rows by eight columns forming sixty-four individual addressable EPROM memory units and each shift register 112-1, . . . , 112-N was a sixteen-stage shift register 112-1, . . . , 112-N, then a particular shift register (e.g., shift register 112-1) could generate both the RS 118 and CS 120 signals sufficient to address the row and column of an addressable EPROM memory unit of any of the arrays when paired with a BS 122 signal. The relationship between the number of stages of the shift register 112-1, . . . , 112-N and the number of individually addressable EPROM memory units can determine how many signals the particular shift register (e.g., shift register 112-1) can generate. So long as the particular shift register (e.g., shift register 112-1) includes enough stages to address both the column and the row portion of a EPROM memory unit address of any of the EPROM arrays of the number of memory banks 114-1, . . . , 114-N once paired with the BS 122 signal, then that particular shift register (e.g., shift register 112-1) can generate both of the RS 118 and CS 120 signals.

A data signal D1 can be used to generate the RS signal 118. The RS signal 118 can identify the logical row portion of an address of an individually addressable EPROM memory unit within any of the EPROM arrays of the memory banks 114-1, . . . , 114-N. The RS signal 118 can be generated by applying a data signal D1 during a particular cycle of a particular select signal S1-1, . . . , S4-N.

A data signal D2 can be used to generate the CS signal 120. The CS signal 120 can identify the logical column portion of an address of an individually addressable EPROM memory unit within any of the EPROM arrays of the memory banks 114-1, . . . , 114-N. The CS signal 120 can be generated by applying a data signal D2 during a particular cycle of a particular select signal S1-1, . . . , S4-N in a particular shift register 112-2.

A data signal D-N can be used to generate the BS signal 122. The BS signal 122 can identify a particular memory bank of the number of memory banks 114-1, . . . , 114-N within which the individually addressable EPROM memory unit logically or physically resides. When the BS signal 122 is paired with the RS signal 118 and the CS signal 120, a three-dimensional EPROM memory unit address is specified. That is, the RS signal 118 and the CS signal 120 represent a two-dimensional EPROM address specifying the logical row (e.g., RS signal 118) and logical column (e.g., CS 120) that are applicable in addressing an EPROM memory unit in any of the EPROM memory banks 114-1, . . . , 114-N. The BS signal 122 introduces a third dimension to the EPROM address that specifies which memory bank 114-1, . . . , 114-N the RS signal 118 and the CS signal 120 are addressed to. In a number of embodiments, the BS signal 122 can specify a single memory bank of a number of memory banks 114-1, . . . , 114-N.

Alternatively, the BS signal 122 can specify more than one of the number of memory banks 114-1, . . . , 114-N allowing for parallel three-dimensional EPROM addressing. For example, D-N can be applied during multiple cycles of a select signal S1, . . . , S4 to address the specified row and column of more than one of the number of memory banks 114-1, . . . , 114-N in parallel.

The RS signal 118, CS signal 120, and BS signal 122 can be input by a corresponding transistor. For example, the RS signal 118 can be input by an RS transistor, the CS signal 120 by a CS transistor, and the BS signal 122 by a BS transistor. The RS, CS, and BS transistors can be NMOS transistors. The RS, CS, and BS transistors can be arranged in any manner that allows for generation of the three-dimensional EPROM address. For example, the BS transistor can be connected with the CS transistor and RS transistor in a cascading/series manner. In another example, the BS transistor can be connected to the gate of the CS transistor and RS transistor. In yet another example, the BS transistor can be connected with the CS transistor and RS transistor through an additional decoder.

The example print head memory device 110 of FIG. 1 demonstrates a three-dimensional memory addressing scheme that allows fewer shift registers 112-1, . . . , 112-N with fewer addressing cycles to address many more addressable EPROM memory units than conventional methods. For example, utilizing the conventional direct addressing method with four sixteen-stage shift registers only four corresponding memory banks of eight-by-eight memory unit EPROM memory arrays could be addressed. That is, the conventional direct addressing method requires four sixteen-stage shift registers to address 256 memory units. In juxtaposition with the conventional method, some examples of the present disclosure would allow three eight-stage shift registers 112-1, . . . , 112-N to generate three-dimensional EPROM memory unit addresses for eight memory banks 114-1, . . . , 114-N of eight-by-eight memory unit EPROM memory arrays. That is, examples of the present disclosure allow three eight-stage shift registers 112-1, . . . , 112-N to address 512 memory units. The present disclosure can allow for fewer and/or smaller shift registers. In the example above, there are three instead of four shift registers and the three shift registers are eight-stage rather than sixteen-stage, saving space both in terms of number and size of shift registers.

Figure 2A:
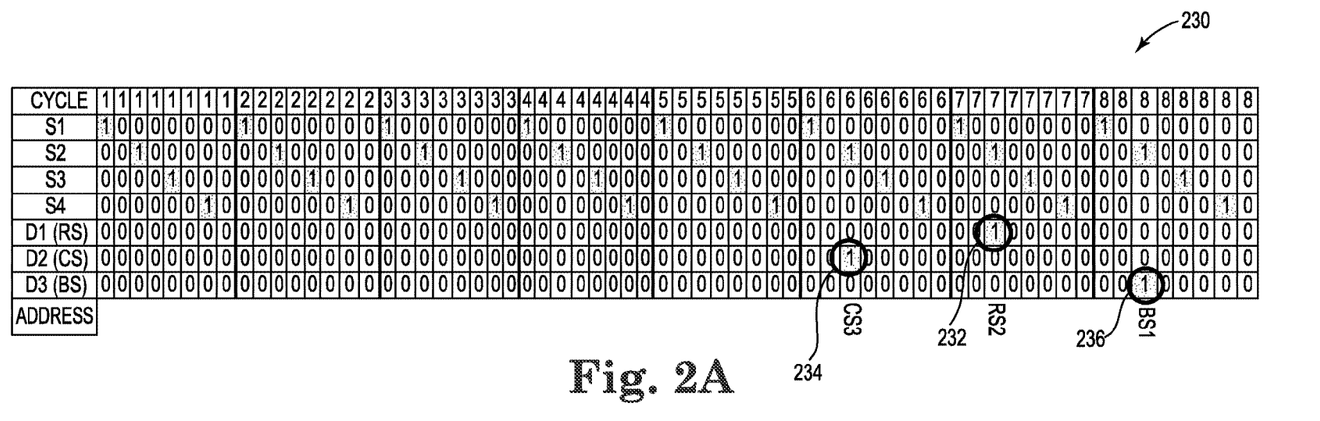
FIG. 2A is a table illustrating an example of the three-dimensional addressing scheme for EPROM according to the present disclosure.
Figure 2B:
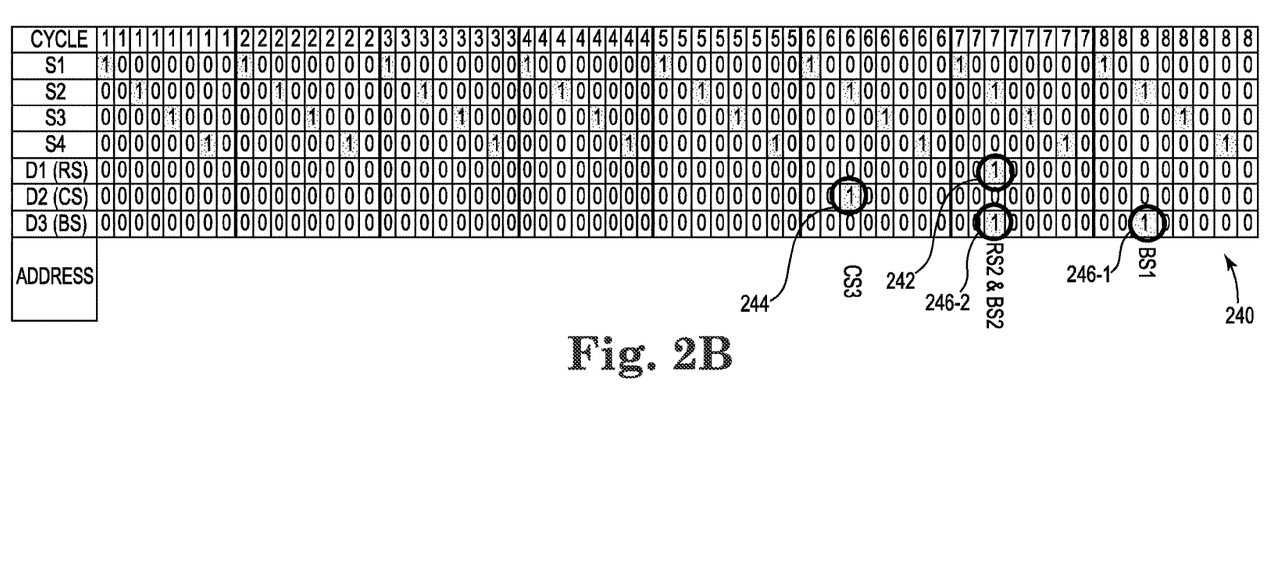
FIG. 2B is a table illustrating an example of the three-dimensional parallel addressing scheme for EPROM according to the present disclosure

FIG. 2A and FIG. 2B are diagrams of examples of the three-dimensional addressing scheme for EPROM. FIG. 2A illustrates a table 230 demonstrating an example of the three-dimensional addressing scheme for EPROM of the present disclosure. The table 230 consists of a number of rows and columns corresponding to signals and the timing of their application, respectively. In table 230, a signal is illustrated as applied when a "1," instead of a "0," appears in the table 230 matrix.

The rows S1, S2, S3, and S4 of table 230 represent select signals S1, S2, S3, and S4 that can be applied to each shift register to precharge and advance each shift register. In table 230, the select signals S1, S2, S3, and S4 are not necessarily select signals of one shift register. That is, the select signals S1, S2, S3, and S4 can symbolize any select signals applied to any of the shift registers which are accepting data signals. To further clarify, referring back to FIG. 1, S1 of table 230 could represent select signals S1-1, S1-2, S1-3, and/or S1-N. Additionally, S2, S3, and S4 of table 230 could represent S2-1, S2-2, S2-3, and/or S2-N; S3-1, S3-2, S3-3, and/or S3-N; and S4-1, S4-2, S4-3, and/or S4-N, respectively. Accordingly, table 230 can illustrate similar select signals S1, S2, S3, and S4 being applied to precharge and advance a number of distinct shift registers.

Each column of table 230 represents a shift register cycle (e.g., cycle 1, cycle 2, cycle 3, cycle 4, cycle 5, cycle 6, cycle 7, cycle 8) wherein cycle 1 is the first cycle to shift in. Since a cycle can correspond to the application of select signals S1-S4, each cycle of table 230 corresponds to four applications of the select signals S1, S2, S3, and S4. Therefore, each cycle corresponds to eight similarly numbered cycle columns over which the select signals of rows S1, S2, S3, and S4 are applied.

Table 230 further illustrates data signals of rows D1 (RS), D2 (CS), and D3 (BS). The data signal of row D1 (RS) can correspond to a data signal D1 specifying a row of a three-dimensional address for EPROM, data signal of row D2 (CS) can correspond to a data signal D2 specifying a column of a three-dimensional address for EPROM, and data signal of row D3 (BS) can correspond to a data signal D3 corresponding to a bank of a three-dimensional address for EPROM. As described above, data signal D1, data signal D2, and data signal D3 illustrated in rows D1 (RS), D2 (CS), and D3 (BS) can be data signals applied in distinct shift registers.

Read together, table 230 illustrates the timing of the application of the aforementioned signals to formulate a three-dimensional address for EPROM (e.g. RS2, CS3, BS1 as output in the address row of table 230). For example, table 230 illustrates that the data signal D1 can be applied during the seventh cycle of select signal corresponding to S2 of an eight-stage shift register. Applied at this time, D1 generates a row-select (RS) signal 232 signifying row select two (RS2). Further illustrated in table 230, data signal D2 can be applied during the sixth cycle of select signal S2 of a shift register to generate a column-select (CS) signal 234 signifying column select three (CS3). Table 230 also illustrates that data signal D3 can be applied during the eighth cycle of select signal S2 of a shift register to generate a bank-select (BS) signal 236 signifying bank select one (BS1). When combined, the RS, CS, and BS signals specify a three-dimensional address for an EPROM memory unit. In the example of FIG. 2A, the three-dimensional address is RS2, CS3, BS1, addressing the memory unit of the second row of the third column of a first EPROM memory bank.

FIG. 2B illustrates a table 240 demonstrating an example of the three-dimensional parallel addressing scheme for EPROM of the present disclosure. The table 240 consists of a number of rows and columns corresponding to signals and the timing of their application, respectively. As with table 230, a signal is illustrated as applied when a "1," instead of a "0," appears in the table 240 matrix. The rows and columns of table 240 illustrate the same basic principles of table 230, except implemented in a parallel addressing scheme. The parallel addressing scheme of table 240 can be achieved by an additional application of the data signal D3. By applying the data signal D3 an additional time the RS signal 242 and CS signal 244 are applicable in parallel to the two EPROM banks specified by the two BS signals 246-1 and 246-2.

For example, table 240 illustrates the timing of the application of the aforementioned signals to formulate parallel three-dimensional addresses for EPROM (e.g., RS2, CS3, BS1 and RS2, CS3, BS2 as output in the address row of table 240). For example, table 240 illustrates that the data signal D1 can be applied during the seventh cycle of select signal corresponding to S2 of an eight-stage shift register. Applied at this time, D1 generates a row-select (RS) signal 242 signifying row select two (RS2). Further illustrated in table 240, data signal D2 can be applied during the sixth cycle of select signal S2 of a shift register to generate a column-select (CS) signal 244 signifying column select three (CS3). Table 240 also illustrates that data signal D3 can be during both the seventh and eighth cycle of select signal S2 of the shift register 240 to generate two BS signals 246-1 and 246-2 signifying bank select one (BS1) and bank select two (BS2), respectively. When combined, the RS, CS, and BS signals specify parallel three-dimensional memory unit addresses for EPROM. In the example of FIG. 2B, the three-dimensional addresses are RS2, CS3, BS1 and RS2, CS3, BS2. RS2, CS3, BS1 is addressing the memory unit of the second row of the third column of a first EPROM memory bank. RS2, CS3, BS2 is addressing the memory unit of the second row of the third column of a second EPROM memory bank. The three-dimensional parallel addressing scheme for EPROM illustrated in table 240 is an inter-bank parallel reading scheme. That is, the three-dimensional parallel addressing scheme for EPROM illustrated in table 240 simultaneously addresses a row and a column among separate EPROM memory banks. Another alternative (not shown) is an intra-bank parallel addressing scheme. In an intra-bank parallel addressing scheme, the D1 and/or D2 signal can be applied multiple times to generate multiple RS and/or CS signals. Therefore, an intra-bank parallel addressing scheme can simultaneously address multiple rows and/or columns of the same EPROM memory bank.

Examples of the present disclosure can include systems for three-dimensional addressing for EPROM on a printing device. Such a system can include a number of EPROM banks. The EPROM banks can be located on a printing device. For example, they can be located on an integrated print head. Each of these EPROM banks can be an EPROM memory array. The EPROM memory array can be an array of EPROM memory units organized into rows and columns.

The system can include a number of shift registers. The number of shift registers can be serial-in parallel-out shift registers. That is, a data string can be serially input into the shift register, but output in parallel format to multiple outputs. For example, the serially input data received via a single physical input (e.g., wire) can be output via multiple physical outputs (e.g., wires) to simultaneously address multiple EPROM banks to which the shift registers are connected.

Each of the shift registers of the system can be synchronized to their corresponding select signals. That is, the select signals that are input into the shift register to precharge the shift register and advance the shift register can comprise a clock pulse determining when each shift of the shift register happens. For example, there can be four repeating select signals (e.g., S1, S2, S3, and S4) serving as clock pulses. A set of the four select signals can be one clock cycle for the shift register. In examples of the present disclosure the shift register can utilize clock cycles in shifting in the data to generate RS, CS, and BS signals. The number of clock cycles associated with the shift register can determine the number of EPROM memory banks and the number of EPROM memory units of each EPROM bank. For example, the number of EPROM memory banks can be equal to the number of clock cycles associated with a shift register generating the BS signal since each clock cycle can correspond to one of the number of EPROM banks. Additionally, the number of rows and the number of columns of EPROM memory units in each EPROM memory array can be equal to the number of clock cycles associated with a shift register specifying a CS and/or RS signal since each clock cycle can correspond to one of the row and/or column designations of the EPROM memory array.

The system can include a row select data signal to specify a row portion of the three-dimensional address for EPROM. For example, the row select data signal can include an indication of the row of the EPROM memory unit within an EPROM memory array being addressed by the three-dimensional address for EPROM. The row select data signal can correspond to a first shift register of the number of shift registers. For example, the row select signal can be input into the first shift register as a data signal and can specify the row portion of the three-dimensional address for EPROM based on when the data signal is applied in relation to a number of select signals.

The system can also include a column select data signal to specify a column portion of the three-dimensional address for EPROM. For example, the column select data signal can include an indication of the column of the EPROM memory unit within an EPROM memory array being addressed by the three-dimensional address for EPROM. The column select data signal can correspond to a second shift register of the number of shift registers. For example, the column select signal can be input into the second shift register as a data signal and can specify the row portion of the three-dimensional address for EPROM based on when the data signal is applied in relation to a number of select signals.

A bank select data signal specifying an EPROM bank portion of the three-dimensional address for EPROM can be included in the system. For example, the bank select data signal can include an indication of the EPROM bank of the number of EPROM banks to which the column of the column select signal and the row of the row select signal are addressed to. The bank select data signal can correspond to a third shift register of the number of shift registers. For example, the bank select signal can be input into the third shift register as a data signal and can specify the row portion of the three-dimensional address for EPROM based on when the data signal is applied in relation to a number of select signals.

Figure 3:
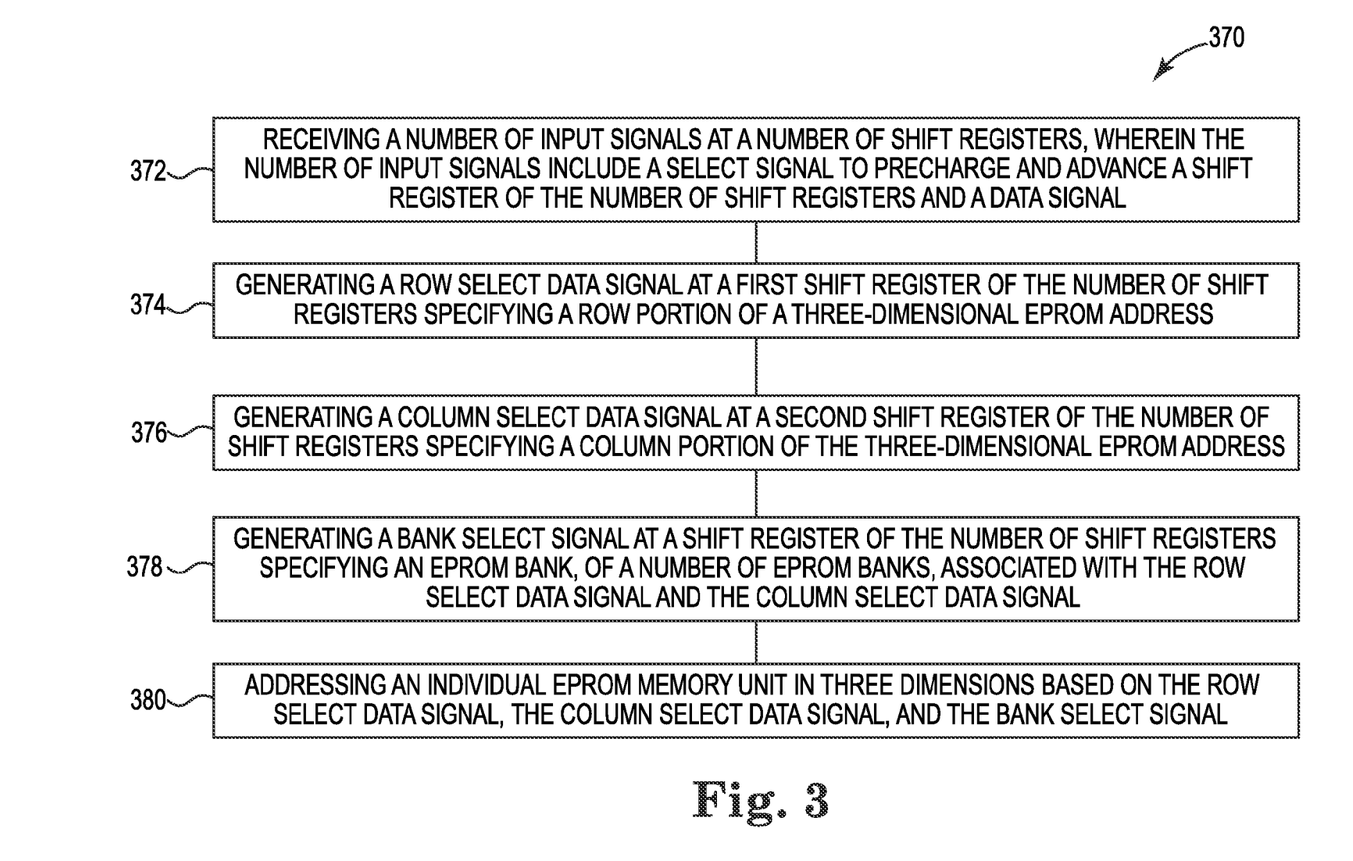
FIG. 3 is a flow chart of an example of a method for three-dimensional addressing of an EPROM memory unit of an integrated print head.

FIG. 3 illustrates a flow chart of an example of a method 370 for three-dimensional addressing of an EPROM memory unit of an integrated print head. At 372, the method 370 can include receiving a number of input signals at a number of shift registers, wherein the number of input signals include a select signal to precharge and advance a shift register of the number of shift registers and a data signal. Each of the shift registers can be connected to each EPROM bank of a number of EPROM banks. For example, each shift register can be in communication with each EPROM bank of the number of EPROM banks such that it can transmit and/or receive data from each of the EPROM memory banks.

At 374, the method 370 can include generating a row select data signal at a first shift register of the number of shift registers specifying a row portion of a three-dimensional EPROM address.

At 376, the method 370 can include generating a column select data signal at a second shift register of the number of shift registers specifying a column portion of the three-dimensional EPROM address.

At 378, the method 370 can include generating a bank select signal at a shift register of the number of shift registers specifying an EPROM bank, of a number of EPROM banks, associated with the row select data signal and the column select data signal.

At 380, the method 370 can include addressing an individual EPROM memory unit in three dimensions based on the row select data signal, the column select data signal, and the bank select signal. The three-dimensional EPROM memory unit address can be generated within eight cycles of the number of shift registers. For example, the number of shift registers can generate a row select signal, a column select signal, and a bank select signal within eight cycles of the shift register receiving the data signal.

In the detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be used and the process, electrical, and/or structural changes may be made without departing from the scope of the present disclosure.

In addition, the proportion and the relative scale of the elements provided in the figures are intended to illustrate the examples of the present disclosure, and should not be taken in a limiting sense. As used herein, the designators "N", particularly with respect to reference numerals in the drawings, indicate that a number of the particular feature so designated can be included with a number of examples of the present disclosure. As used herein, "a" or "a number of" something can refer to one or more such things.

What is claimed:

1. A device for use with a print head, comprising:
a plurality of memory arrays of storage units storing data for the print head; and
a plurality of flip-flop circuits connected to the plurality of memory arrays,
wherein the plurality of flip-flop circuits is to receive data signals and generate a three-dimensional address of one of the storage units in the plurality of memory arrays, the three-dimensional address comprising:
a first select signal to identify a first portion of the three-dimensional address of the storage unit in the plurality of memory arrays,
a second select signal to identify a second portion of the three-dimensional address of the storage unit in the plurality of memory arrays, and
a third select signal, generated by one of the plurality of flip-flop circuits, to identify a third portion of the three-dimensional address of the storage unit in the plurality of memory arrays.

2. The device of claim 1, wherein the data signals include first, second, and third data signals, and wherein the plurality of flip-flop circuits includes:
a first cascade flip-flop circuit to receive the first data signal and generate the first select signal,
a second cascade flip-flop circuit to receive the second data signal and generate the second select signal, and
a third cascade flip-flop circuit to receive the third data signal and generate the third select signal.

3. The device of claim 1, wherein the data signals include first, second, and third data signals, and wherein the plurality of flip-flop circuits includes:
a first cascade flip-flop circuit to receive the first and second data signals and generate the first and second select signals, respectively, and
a second cascade flip-flop circuit to receive the third data signal and generate the third select signal.

4. The device of claim 1, wherein each of the plurality of flip-flop circuits includes an additional input to receive a select input signal to advance the flip-flop circuit.

5. The device of claim 1, wherein, to locate two storage units in the plurality of memory arrays, the plurality of flip-flop circuits is to:
during a first clock cycle, generate a first array select signal that identifies a first memory array of the plurality of memory arrays,
address a first storage unit in the first memory array based on the first select signal, the second select signal, and the first array select signal,
during a second clock cycle, generate a second array select signal that identifies a second memory array of the plurality of memory arrays, and
address a second storage unit in the second memory array based on the first select signal, the second select signal, and the second array select signal.

6. The device of claim 1, wherein the third select signal identifies more than one memory arrays of the plurality of memory arrays associated with the first portion and the second portion of the three-dimensional address to generate a parallel three-dimensional address.

7. The device of claim 1, wherein the plurality of flip-flop circuits is a plurality of shift registers.

8. A method for addressing one of a plurality of storage units in a plurality of memory arrays storing data for a print head, comprising:
in response to receipt of data signals, generating, by a plurality of flip-flop circuits, a three-dimensional address of the storage unit in the plurality of memory arrays, the three-dimensional address including:
a first select signal that identifies a first portion of the three-dimensional address of the storage unit in the plurality of memory arrays,
a second select signal that identifies a second portion of the three-dimensional address of the storage unit in the plurality of memory arrays, and
a third select signal that identifies a third portion of the three-dimensional address of the storage unit in the plurality of memory arrays; and
addressing, by the plurality of flip-flop circuits, the storage unit in the plurality of memory arrays based on the first, second, and third select signals.

9. The method of claim 8, wherein the data signals include first, second, and third data signals, the plurality of flip-flop circuits includes first, second, and third shift registers, and the method comprises:
receiving, by the first shift register, the first data signal and generating the first select signal,
receiving, by the second shift register, the second data signal and generating the second select signal, and
receiving, by the third shift register, the third data signal and generating the third select signal.

10. The method of claim 8, wherein the data signals include first, second, and third data signals, the plurality of flip-flop circuits includes first and second shift registers, and the method comprises:
receiving, by the first shift register, the first and second data signals and generating the first and second select signals, respectively, and
receiving, by the second shift register, the third data signal and generating the third select signal.

11. The method of claim 8, further comprising:
receiving, by each of the plurality of flip-flop circuits, a select input signal to advance the flip-flop circuit.

12. The method of claim 8, further comprising:
during a first clock cycle, generating, by the plurality of flip-flop circuits, a first array select signal that identifies a first memory array of the plurality of memory arrays;
addressing a first storage unit in the first memory array based on the first select signal, the second select signal, and the first array select signal;
during a second clock cycle, generating, by the plurality of flip-flop circuits, a second array select signal that identifies a second memory array of the plurality of memory arrays; and
addressing a second storage unit in the second memory array based on the first select signal, the second select signal, and the second array select signal.

13. A system for use with a print head, comprising:
a plurality of flip-flop circuits to receive first, second, and third data signals and generate a three-dimensional address of one of a plurality of storage units in a plurality of memory arrays storing data for the print head, the plurality of flip-flop circuits comprising:
a first flip-flop circuit to receive the first data signal and generate a first select signal to identify a first portion of the three-dimensional address of the storage unit in the plurality of memory arrays,
a second flip-flop circuit to receive the second data signal and generate a second select signal to identify a second portion of the three-dimensional address of the storage unit in the plurality of memory arrays, and a third flip-flop circuit to receive the third data signal and generate a third select signal to identify a third portion of the three-dimensional address of the storage unit in the plurality of memory arrays, wherein the first, second, and third select signals are transmitted to the plurality of memory arrays to address the storage unit in the plurality of memory arrays.

14. The system of claim 13, wherein the third flip-flop circuit is to:

during a first clock cycle, generate a first array select signal that identifies a first memory array of the plurality of memory arrays, wherein the first select signal, the second select signal, and the first array select signal are used by the plurality of flip-flop circuits to address a first storage unit in the first memory array, and during a second clock cycle, generate a second array select signal that identifies a second memory array of the plurality of memory arrays, wherein the first select signal, the second select signal, and the second array select signal are used by the plurality of flip-flop circuits to address a second storage unit in the second memory array.

15. The system of claim 13, wherein the third select data signal specifies more than one of the plurality of memory arrays associated with the first portion and the first portion of the three-dimensional address to generate a parallel three-dimensional address.

* * * * *